United States Patent [19]
Erhart et al.

[11] Patent Number: 5,128,632
[45] Date of Patent: Jul. 7, 1992

[54] ADAPTIVE LOCK TIME CONTROLLER FOR A FREQUENCY SYNTHESIZER AND METHOD THEREFOR

[75] Inventors: Richard A. Erhart, Chandler, Ariz.; Omid Tabernia, Coconut Creek; Barry W. Herold, Boca Raton, both of Fla.

[73] Assignee: Motorola, Inc., Schaumburg, Ill.

[21] Appl. No.: 700,966

[22] Filed: May 16, 1991

[51] Int. Cl.⁵ .................. H03L 7/089; H03L 7/10; H03L 7/183
[52] U.S. Cl. .................. 331/1 A; 331/16; 331/17; 331/25; 331/DIG. 2; 455/260
[58] Field of Search .................. 331/1 A, 4, 8, 16, 17, 331/25, DIG. 2; 455/260

[56] References Cited

U.S. PATENT DOCUMENTS

| | | | |
|---|---|---|---|
| 4,167,711 | 9/1979 | Smoot | 331/17 |
| 4,419,633 | 12/1983 | Phillips | 331/DIG. 2 |
| 4,893,094 | 1/1990 | Herold et al. | 331/1 A |
| 4,901,033 | 2/1990 | Herold et al. | 331/1 A |
| 4,926,141 | 5/1990 | Herold et al. | 331/16 |

OTHER PUBLICATIONS

Study Report CS85-21 of the Institute of Electronics Information and Communications Engineers of Japan, vol. 85, No. 40, published May 25, 1985, entitled "Fast Phase Tracking Performance of a Phase-Initialized Frequency Synthesizer".

*Primary Examiner*—David Mis
*Attorney, Agent, or Firm*—Philip P. Macnak; Vincent B. Ingrassia; William E. Koch

[57] ABSTRACT

An adaptive lock time controller for a phase locked loop having dividers for generating first and second loop timing signals, a phase detector, a voltage controlled oscillator, and a charging circuit for generating at least a first control signal for converging the output frequency to one or more predetermined frequency channels and a second control signal for maintaining the output frequency substantially constant, comprises a synchronization generator, a phase lock detector, and a control signal selector. The synchronization generator is responsive to the phase detector for synchronizing the phase lock detector. The phase lock detector detects phase locked and unlocked conditions by generating a count representative of the phase difference between the first and second loop timing signals. When the count generated exceeds a predetermined count, a phase locked condition exists, otherwise the loop is unlocked. The control signal selector selects the first control signal during the predetermined time interval when the phase unlocked condition is detected, and the second control signal when the phase locked condition is detected.

15 Claims, 10 Drawing Sheets

FIG. 1A    FREF    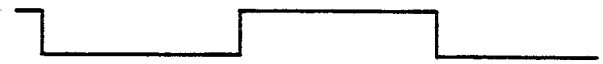
FIG. 1B    FV    
FIG. 1C    PUMP UP    
FIG. 1D    PUMP DOWN    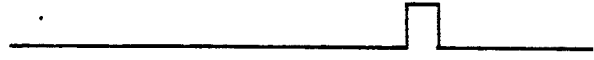
FIG. 1E    FREF    
FIG. 1F    FV    
FIG. 1G    PUMP UP    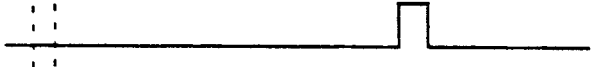
FIG. 1H    PUMP DOWN    
FIG. 1I    FREF    
FIG. 1J    FV    
FIG. 1K    PUMP UP    
FIG. 1L    PUMP DOWN    
Prior Art

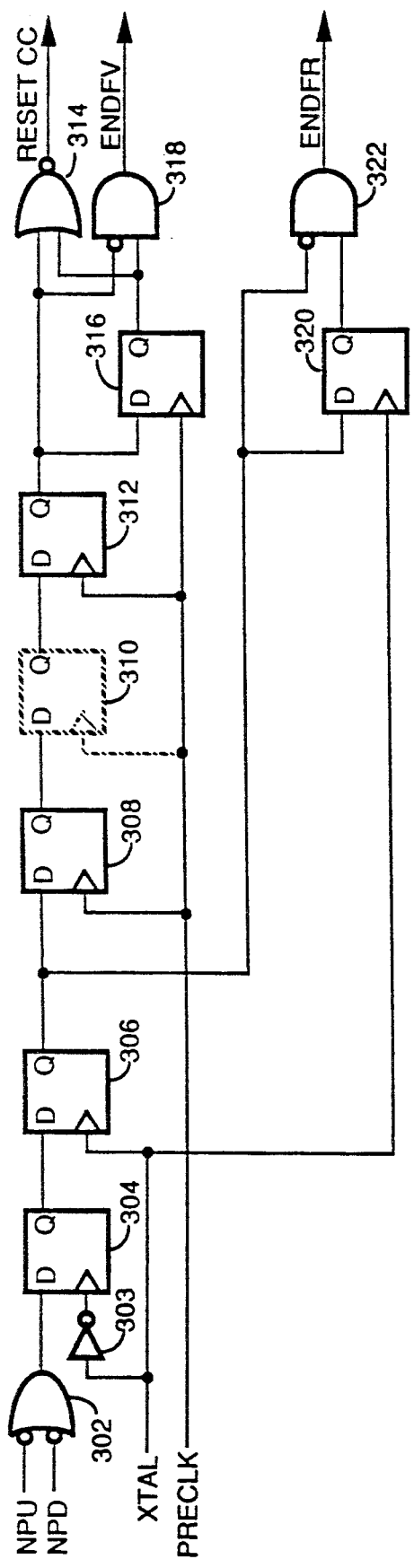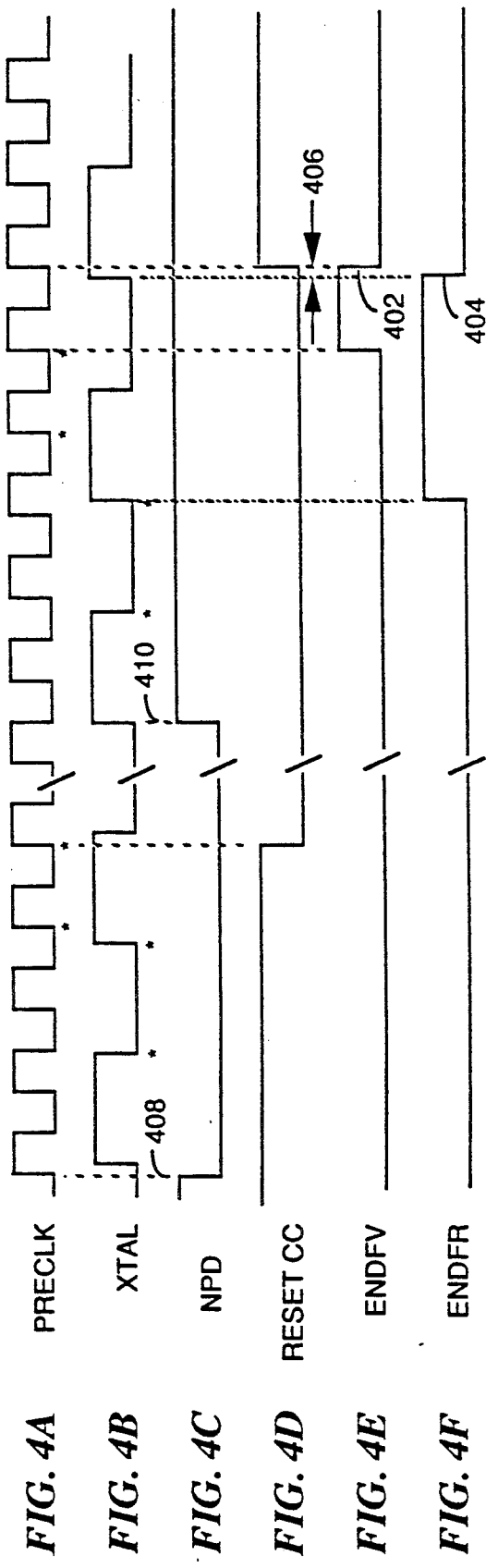
FIG. 3
FIG. 4A  PRECLK
FIG. 4B  XTAL
FIG. 4C  NPD
FIG. 4D  RESET CC
FIG. 4E  ENDFV
FIG. 4F  ENDFR

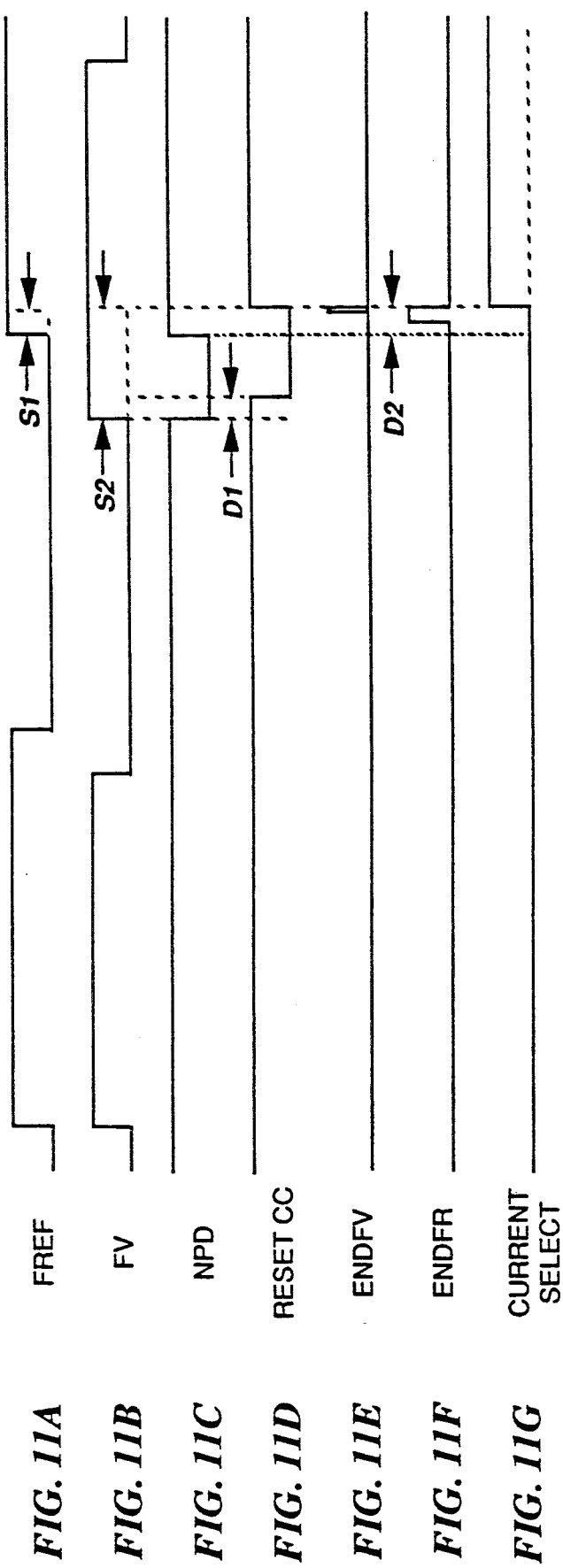

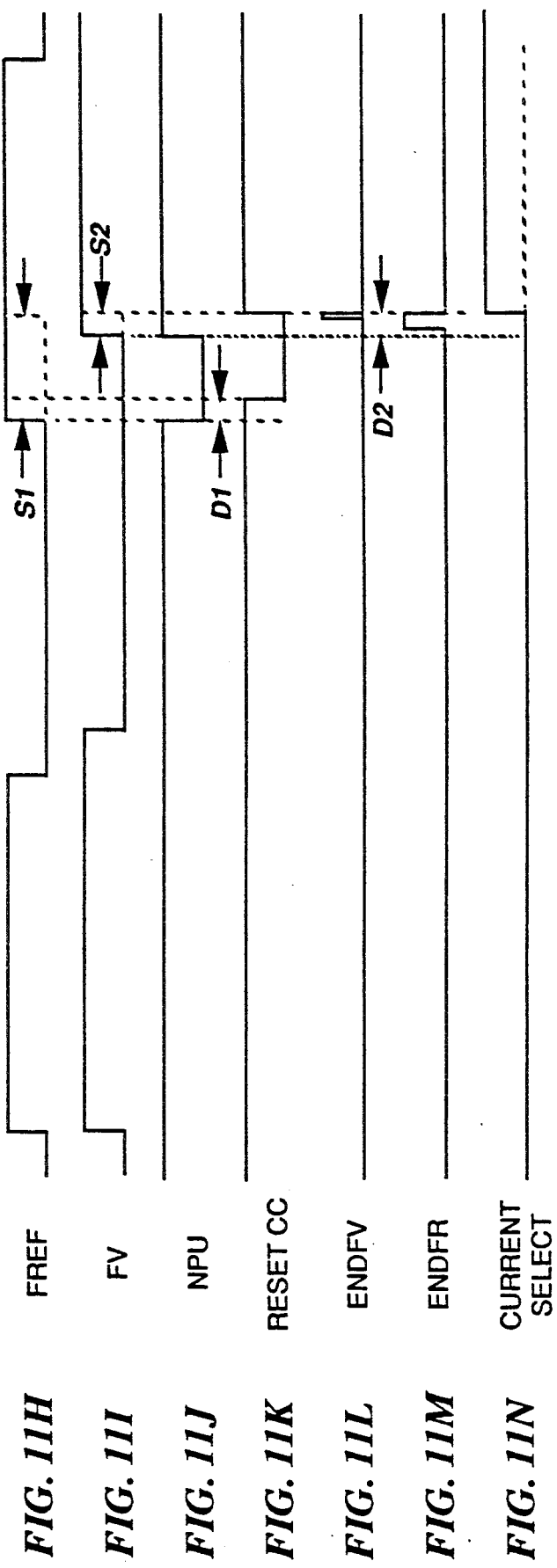

ADAPTIVE LOCK TIME CONTROLLER FOR A FREQUENCY SYNTHESIZER AND METHOD THEREFOR

BACKGROUND OF THE INVENTION

The present invention relates to frequency synthesizers, and more particularly to a control circuit coupled to the frequency synthesizer for enhancing the loop locking time.

A frequency synthesizer may be used in a radio receiver, for example, to generate a channel frequency signal which is used in a demodulator section to pass received information signals only within a desired channel represented by the generated channel frequency signal. Other applications of a frequency synthesizer include tone generating circuits for an electronic organ and oscillator circuits for controlling the operational frequency of a microprocessor, for example.

A frequency synthesizer generally includes a reference oscillator which generates a very stable reference frequency signal and another oscillator which is controlled by a voltage potential to generate the channel frequency signal. A feedback frequency signal is developed from the channel frequency signal via a divide-by-N circuit. A phase detector circuit operates to converge the phase of the feedback frequency signal to the phase of the reference frequency signal by adjusting the governing voltage potential of the voltage controlled oscillator. The elements of the phase detector, the voltage controlled oscillator, and the divide-by-N counter constitute, in combination, what is generally referred to as a phase locked loop.

In most phase locked loops, a storage device such as a capacitor, for example, is coupled between the phase detector and voltage controlled oscillator. The phase detector implementation governs the sourcing and sinking of current to and from the capacitor in order to adjust the voltage thereacross which governs the channel frequency of the signal generated by the voltage controlled oscillator. An example of such a phase locked loop is described in U.S. Pat. No. 4,167,711 issued to George Smoot on Sept. 11, 1979, and assigned to the same assignee as the instant application.

The magnitudes of the source and sink currents generated in the phase detector govern how rapidly the voltage controlled oscillator "sweeps" or "locks" to the desired channel frequency. However, prior art phase locked loop designs were required to generate source and sink current magnitudes which were a compromise between that required for rapid loop lock times and that required to insure loop locking when a different operating frequency was selected. These problems are best understood by examining the operation of these prior art phase locked loops, as shown in FIGS. 1A-L. In particular, FIGS. 1A-1D illustrate the prior art VCO adjustment when the VCO is operating somewhat faster than the desired operating frequency. FIGS. 1E-1H illustrate the prior art VCO adjustment when the VCO is operating slower than the desired operating frequency. And FIGS. 1I-1L illustrate the prior art VCO adjustment when the VCO is operating significantly faster than the desired operating frequency.

Referring to FIGS. 1A-1D, because the feedback clock shown in FIG. 1B was operating somewhat faster than the reference clock shown in FIG. 1A, it was necessary to provide a PUMP DOWN signal from the phase detector, as shown in FIG. 1D. However, as shown, because the phase of the reference clock lead the feedback clock, a PUMP UP signal was initially generated as shown in FIG. 1C, forcing the loop to initially speed up, after which the PUMP DOWN signal was generated providing a correction in the proper direction to the feedback clock frequency.

Referring to FIGS. 1E-1H, because the feedback clock shown in FIG. 1F was operating somewhat slower than the reference clock shown in FIG. 1E, it was necessary to provide a PUMP UP signal from the phase detector, as shown in FIG. 1G. However, as shown, because the phase of the feedback clock lead the reference clock, a PUMP DOWN signal was initially generated as shown in FIG. 1H, forcing the loop to initially slow down, after which the PUMP UP signal was generated providing a correction in the proper direction to the feedback clock frequency.

Referring to FIGS. 1I-1L, because the feedback clock shown in FIG. 1J was operating significantly faster than the reference clock shown in FIG. 1L, it was necessary to provide a PUMP DOWN signal from the phase detector. However, as shown, because the phase of the reference clock lead the feedback clock, a PUMP UP signal was initially generated as shown in FIG. 1K, forcing the loop to initially speed up, after which the PUMP DOWN signal was generated providing a correction in the proper direction to the feedback clock frequency.

In summary, incorrect loop adjustments were often generated in the prior art phase locked loops due to the operation of the phase comparison techniques. The prior art phase locked loops consequently required a careful selection of the PUMP UP and PUMP DOWN control currents to insure the loop would lock under any frequency change condition. As a result, the rate at which such loop locking could be achieved was greatly compromised, resulting in long loop locking times, often requiring many reference frequency clock periods to achieve lock. There is a need to provide a means and method for providing reduced loop locking times which are independent of the actual VCO frequency or phase encountered prior to initiating a change in the operating frequency of the phase locked loop.

SUMMARY OF THE INVENTION

In accordance with the present invention, an adaptive lock time controller for a phase locked loop which includes dividers for generating first and second loop timing signals, a phase detector for detecting phase differences between first and second loop timing signals, a voltage controlled oscillator for generating an output frequency, and a charging circuit for generating at least a first control signal for converging the output frequency to one or more predetermined frequency channels and a second control signal for maintaining the output frequency substantially constant, comprises a synchronization generator, a phase lock detector, and a control signal selector. The synchronization generator is responsive to the phase detector for generating a synchronization signal having a period representative of the phase difference between the first and second loop timing signals for substantially synchronizing the first and second loop timing signals during a predetermined time interval. The phase lock detector detects phase locked and unlocked conditions during the predetermined time interval by generating a count representative of the phase difference between the first and second loop timing signals. When the count generated exceeds a predetermined count, a phase locked condition exists, otherwise the loop is unlocked. The control signal selector selects the first control signal during the predetermined time interval when the phase unlocked condition is detected, and the second control signal when the phase locked condition is detected.

BRIEF DESCRIPTION OF THE DRAWINGS

FIGS. 1A-1L depict timing waveforms A-L which illustrate the frequency locking operation of prior art frequency synthesizers.

FIG. 3 is a logic circuit schematic of an embodiment suitable for use as a reset and control synchronization (bandwidth control) circuit of the frequency synthesizer depicted in FIG. 2.

FIGS. 4A-4F are timing diagrams illustrating the operation of the reset and control synchronization (bandwidth control) circuit depicted in FIG. 3.

FIGS. 11A-11N depict timing waveforms A-N which illustrate an operation of the bandwidth control circuit embodiment depicted in FIG. 3.

DESCRIPTION OF THE PREFERRED EMBODIMENT

Figure 2:
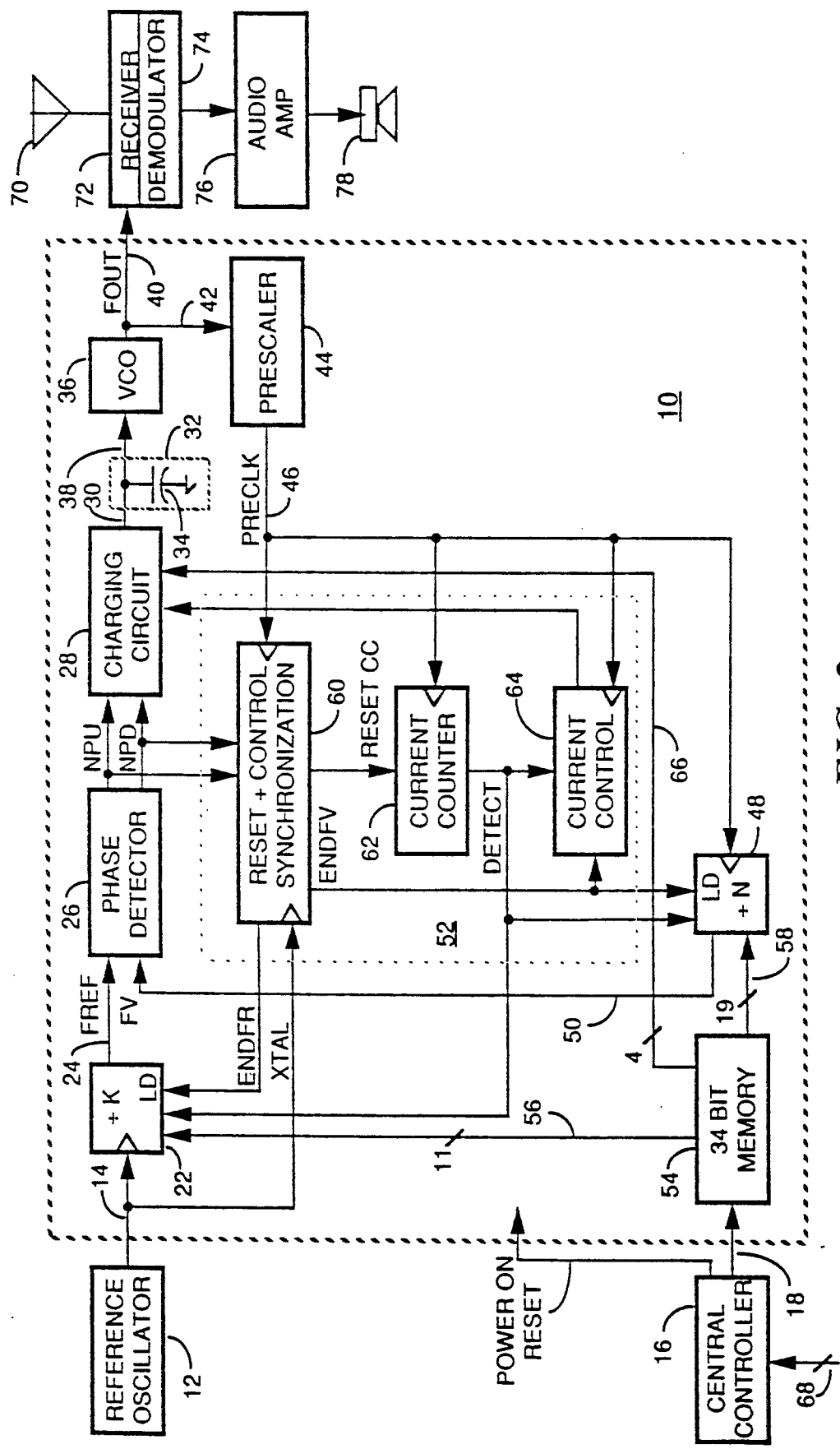
FIG. 2 is a block diagram schematic of a frequency synthesizer suitable for embodying the broad principles of the present invention.

Shown within the outer dot-dashed lines in FIG. 2, as part of the frequency synthesizer, is a phase locked loop 10. Ancillary to the phase locked loop 10, but essential to the operation of the frequency synthesizer, is a reference oscillator 12 which generates a very stable reference clock signal over signal line 14, and a central controller 16 which provides digital control and data signals to the phase locked loop over signal lines 18. The central controller 16 may also be used to generate a battery saver signal as described in U.S. Pat. No. 4,893,094 issued to Herold et al. on Jan. 9, 1990, and assigned to the same assignee as the instant application.

In the present embodiment, the reference clock signal 14, indicated as XTAL, is provided to the clock input of a divide-by-K prescaler circuit 22 and to an adaptive lock time controller 52. The resulting reference frequency signal 24, indicated as FREF, which is generated by the divide-by-K prescaler circuit 22 is provided to a first input of a phase detector circuit 26. Command signals NPU and NPD which are generated by the phase detector circuit 26 are coupled to a charging circuit 28 and to the adaptive lock time controller 52. Charging circuit 28 has an output 30 coupled to a storage device 32 which may include a capacitor 34 coupled between the signal line 30 and ground potential. A signal representative of the voltage potential across the storage capacitor 34 is coupled to a voltage controlled oscillator (VCO) 36 utilizing signal line 38. The VCO 36 generates a signal having a frequency commensurate with the voltage potential of signal line 38, over signal line 40 for use by an electronic device such as a radio receiver 72, for example. An alternate embodiment of the storage device is described in U.S. Pat. No. 4,893,094 issued to Herold et al.

The frequency signal generated by the VCO 36 may be coupled over signal line 42 to a prescaler circuit 44 for generating a prescaled frequency signal PRECLK. It will be appreciated, prescaler circuit 44 is utilized when high frequency signals are generated by the VCO 36 which must be divided to a lower frequency to enable processing by the other circuits within the phase locked loop 10. When the prescaler is utilized, the prescaled frequency signal PRECLK is coupled over signal line 46 to the clock input of the divide-by-N circuit 48, and to adaptive lock time controller 52. The output of the divide-by-N circuit 48, referred to as the feedback frequency signal FV, is coupled to a second input of the phase detector 26 over signal line 50.

The central controller 16 may provide from time to time, for programming purposes, such as information which is coupled to the central controller 16 over signal line 68 to a memory circuit 54 which then distributes the digital information to the divide-by-K prescaler circuit 22, the charging circuit 28, and the divide-by-N circuit 48. While a 34 bit memory is shown in FIG. 2, it will be appreciated that other memory sizes may be utilized as well, depending upon such factors as the dividing ratios of the divide-by-K prescaler 22 and the divide-by-N counter 48. The digital information distributed to the divide-by-K prescaler 22 and the divide-by-N circuit 48 are loaded therein under the control of the adaptive lock time controller 52, as will be described below. More specifically, 11 bits of data are provided to the divide-by-K prescaler circuit 22 over data lines 56 to set the value of K in the operation thereof. In addition, 19 bits of data are provided to the divide-by-N circuit 48 over data lines 58 to set the value of N in the operation thereof. Further, four bits of data are coupled from the memory 54 over data lines 66 to the charging circuit 28. A first two of the four bits are used to select a first, or initial phase lock loop bandwidth, and the second two of the four bits are used to select a second, or final phase lock loop bandwidth. The selection of the phase lock loop bandwidth is controlled by the adaptive lock time controller 52, as will be described below.

The central controller 16 may also from time to time provide new values for the divide-by-K prescaler circuit 22 and the divide-by-N circuit 48 which are loaded into the 34 bit memory 54 via signal line 68 in order to change the frequency of the signal 40 between predetermined channels. Concurrently with the switching of synthesized frequency, new loop bandwidth values for control of the phase locked loop 10 can also be loaded into the 34 bit memory 54 via signal line 68. The frequency and bandwidth values which are loaded via signal line 68 can be stored in a non-volatile memory (not shown), such as a programmable read only memory (PROM) or electrically erasable programmable read only memory (EEPROM), which is preprogrammed for the various selectable operating frequencies. When a new operating frequency is selected, the high loop bandwidth condition corresponding thereto is initially selected by selecting the first two bits of the four bits of data which coupled over data lines 66 to the charging circuit 28 which enables a fast adaptive locking time. As the loop 10 approaches a phase locked condition, the loop bandwidth is then changed to the low loop bandwidth condition by selecting the second two of the four bits coupled over data line 66 which enables a slow adaptive locking time. The method for switching between loop bandwidths which is automatically controlled by the adaptive lock time controller 52 is described in further detail below.

The adaptive lock time controller 52 shown in FIG. 2 comprises a reset and control synchronization circuit 60, which functions as a means for generating, is utilized to advantageously to generate synchronization signals to control the synchronization of the reference frequency signal FREF and the feedback frequency signal FV during the phase locking operation. A current counter 62, which functions as a means for detecting, is used to detect the relative degree of similarity or difference between the reference frequency signal and the feedback frequency signal during the phase locking operation. The current control circuit 64, which functions as a means for selecting, is used to control the selection of currents generated within the charging circuit 28 to establish high and low bandwidth conditions.

When utilized in a communication receiver, the phase locked loop output 40 couples to a receiver 72 which is used to receive transmitted communication signals which are intercepted by antenna 70 in a manner well known in the art. The received communication signals are demodulated by a demodulator 74. The demodulated communication signals are then coupled to an audio processing circuit, such as an audio amplifier 76, which amplifies the audio signal to a level suitable for reproduction via a speaker 78. While not shown, the demodulated communication signals may also be a stream of digital information which may be further processed, such as using a decoder, to enable the reception of numeric and alphanumeric messages, also in a manner well known in the art.

Referring to FIG. 3 is shown a logic circuit schematic of an embodiment suitable for use as the reset and control synchronization circuit 66 utilized within the adaptive lock time controller 52 of the frequency synthesizer depicted in FIG. 2. The command signals NPU (pump up not) and NPD (pump down not) are coupled into inverting inputs of OR gate 302, which results in a logic one level being generated at the output of OR gate 302 when either the NPU or NPD command signals are active, i.e. operative in the logic zero state. The output of OR gate 302 couples to the data input of D flip-flop 304. The clock input of D flip-flop 304 is coupled to the output of INVERTER 303 which inverts the reference clock signal XTAL coupled over line 14 to the input of INVERTER 303, and which results in the current output of OR gate 302 being loaded into D flip-flop 304 on the falling edge of each reference clock signal XTAL. The output of D flip-flop 304 is coupled to the data input of D flip-flop 306. The clock input of D flip-flop 306 is also coupled to the reference clock signal XTAL, which results in the current output of D flip-flop 304 being loaded into D flip-flop 306 on the rising edge of each reference clock signal XTAL.

The output of D flip-flop 306 couples to the data input of D flip-flop 308, to the data input of D flip-flop 320, and to the inverting input of AND gate 322. The clock input of D flip-flop 308 is coupled to the prescaled frequency signal PRECLK over signal line 46, which results in the current output of D flip-flop 306 being loaded into D flip-flop 308 on the rising edge of each prescaled frequency signal PRECLK. The output of D flip-flop 308 may then couple to the data input of D flip-flop 310 or to the data input of D flip-flop 312, depending on the delay ultimately required to synchronize the reference frequency signal FREF and the feedback frequency signal FV, as will be described below. It will be appreciated that additional D flip-flops 310 may be utilized in series to provide additional synchronization delay adjustment. The clock input of D flip-flop 310 (when used) is coupled to the prescaled frequency signal PRECLK, which results in the current output of D flip-flop 308 being loaded into D flip-flop 310 on the rising edge of each prescaled frequency signal PRECLK. The clock input of D flip-flop 312 is coupled to the prescaled frequency signal PRECLK, which results in the current output of D flip-flop 310 (when used), or 308, being loaded into D flip-flop 312 on the rising edge of each prescaled frequency signal PRECLK. The output of D flip-flop 312 couples to the data input of D flip-flop 316, a first input of NOR gate 314, and an inverting input of AND gate 318. The output of D flip-flop 312 is coupled to a second input of NOR gate 314, which generates a current counter reset signal, RESET CC, at the output of NOR gate 314, the function of which will be described in further detail below.

The clock input of D flip-flop 316 is coupled to the prescaled frequency signal PRECLK, which results in the current output of D flip-flop 312 being loaded into D flip-flop 316 on the rising edge of each prescaled frequency signal PRECLK. The output of D flip-flop 316 couples to a second input of AND gate 318, and together with the output of D flip-flop 312 which couples to the inverting input of AND gate 318, results in the generation of a feedback frequency end signal ENDFV having a period equal to one prescaled frequency signal period when the loss of command signals NPU or NPD are detected at the output of D flip-flop 312.

The clock input of D flip-flop 320 is coupled to the reference clock signal XTAL, which results in the current output of D flip-flop 306 being loaded into D flip-flop 320 on the rising edge of each reference clock signal XTAL. The output of D flip-flop 320 couples to a second input of AND gate 322, and together with the output of D flip-flop 306 which couples to the inverting input of AND gate 322, results in the generation of a reference frequency end signal ENDFR having a period equal to one reference clock signal period when the loss of command signals NPU or NPD are detected as described below at the output of D flip-flop 306.

FIG. 4 depicts timing waveforms A-F illustrating the operation of the reset and control synchronization circuit depicted in FIG. 3. In particular, waveform 4A shows the prescaled frequency signal PRECLK waveform, which as shown, is operating at a substantially higher frequency as compared to the reference clock signal XTAL depicted by waveform 4B. Table I below lists typical operating frequencies and divider constants for a phase locked loop constructed in accordance with the present invention.

TABLE I

| Function | Symbol | Typical Value |
| --- | --- | --- |
| Output Frequency | FOUT | 180 Megahertz |
| Prescaler Division | | ÷32 |
| Prescaled Reference Frequency | PRECLK | 5.625 MHz |
| Divide-by-N Counter | ÷N | 900 |
| Feedback Frequency Signal | FV | 6.25 KHz |
| Reference Clock Signal | XTAL | 2.1 MHz |
| Divide-by-K Counter | ÷K | 336 |
| Reference Frequency Signal | FREF | 6.25 KHz |

As shown in TABLE I, the values of the feedback frequency signal FV and the reference frequency signal FREF are the same, such as would occur when the phase locked loop is in a frequency locked condition.

As depicted in waveform 4C, when either the NPU or NPD command signals are generated, as exemplified by the NPD command signal being set to a logic zero as shown, or the NPU command signal being set to a logic zero (not shown), the current counter reset signal RESET CC will be generated as depicted in waveform 4D, so long as the NPU or NPD command signals were present for a time period sufficient to be captured by flip-flop 304 of the reset and control synchronization circuit, as shown. The current counter reset signal RESET CC is generated following a time period equal to the time required for the sequential detection of a first falling edge and a second rising edge of the reference clock signal XTAL and the sequential detection of two rising edges of the prescaled frequency signal PRECLK (the detected edges are identified by the use of asterisks *). As described above, more than two rising edges may have to be detected for the prescaled frequency signal PRECLK to insure the loading of the divide-by-K and divide-by-N counters at substantially the same time at the start of each reference clock signal period.

Following the termination of either of the NPU or NPD command signals, as depicted by waveform 4C, the feedback frequency end signal ENDFV is generated, as depicted by waveform 4E again following the sequential detection of a first falling edge and a second rising edge of the reference clock signal XTAL, and at least two rising edges of the prescaled frequency signal PRECLK. Following the generation of the feedback frequency end signal ENDFV, the current counter reset signal RESET CC is returned to a logic one level. The reference frequency end signal ENDFR is also generated, as depicted by waveform 4F following the detection of the first falling edge and the second rising edge of the reference clock signal XTAL.

As shown in FIGS. 4E and 4F, the divide-by-N counter 48 is loaded on the falling edge 402 of the feedback frequency end signal ENDFV, and the divide-by-K counter 22 is loaded on the falling edge 404 of the reference frequency end signal ENDFR. By adjusting the phase, or delay, between the reference clock signal XTAL and the prescaled frequency signal PRECLK, the feedback frequency end signal ENDFV and the reference frequency end signal ENDFR can be generated substantially simultaneously, which results in a substantially simultaneous loading of the divide-by-K prescaler and the divide-by-N counter during each reference clock signal period during the fast adaptive lock portion of the phase locking cycle. Synchronization of the loading of the divide-by-K and divide-by-N registers can be achieved to an interval of one-half of the prescaled frequency signal period, or better, by proper selection of the delays generated by D flip-flops 308, 310 and 312. By minimizing the phase difference 406 between the reference clock signal XTAL and the prescaled frequency signal PRECLK, the erroneous phase locking operation common to the prior art phase lock loops is eliminated, resulting advantageously in the ability to significantly increase the loop bandwidth during frequency switching, thereby significantly improving the lock timing performance of the phase lock loop.

In summary, the reset and control synchronization circuit 60 generates a signal ENDFR for loading the divide-by-K counter, and a signal ENDFV for loading the divide-by-N counter at the beginning of each reference clock signal period. The two counter load signals, ENDFR and ENDFV, are generated substantially simultaneously during fast adaptive lock time operations, and insures that only the detected phase differences occurring during the end of each reference clock signal period are used to generate the NPD and NPU command signals, thereby enabling the use of larger loop bandwidths to insure fast loop locking times.

Figure 5:
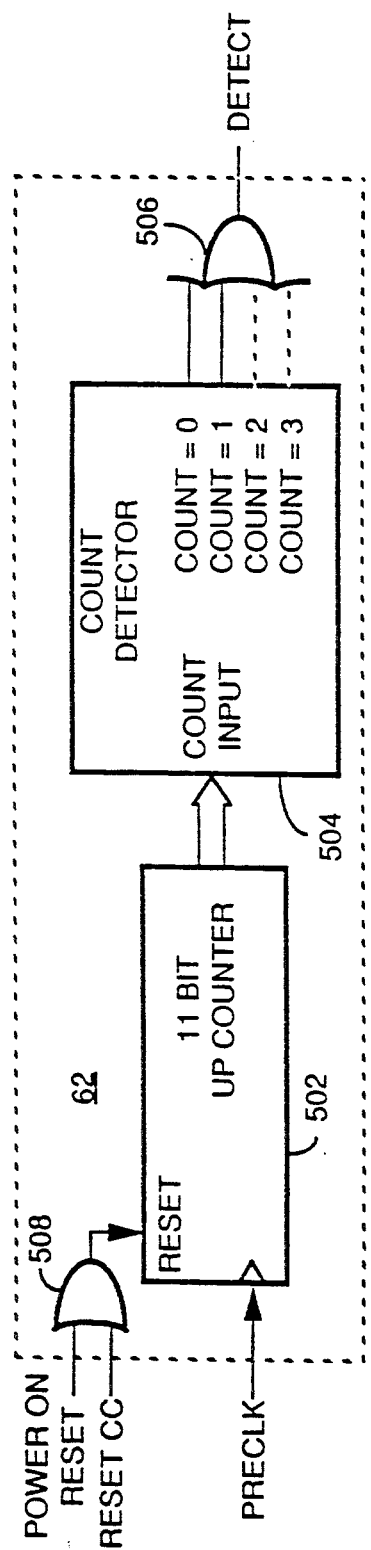
FIG. 5 is a logic circuit schematic of an embodiment suitable for use as a current counter circuit of the frequency synthesizer depicted in FIG. 2.

FIG. 5 is a logic circuit schematic of an embodiment suitable for use as a current counter circuit 62 for the adaptive lock time controller 52 of the frequency synthesizer depicted in FIG. 2. As shown in FIG. 5, the current counter circuit 62 comprises an UP counter, which in the preferred embodiment of the present invention is eleven bits in length. The length of the current counter is determined by several factors including, but not limited to, the maximum frequency excursion generated when switching from one VCO frequency to another, and the prescaled frequency signal PRECLK prior to frequency switching. It will be appreciated that other divider lengths may be utilized as well, depending upon the maximum frequency excursion generated when switching from one frequency to another, and the prescaled frequency signal PRECLK prior to frequency switching. The prescaled frequency signal PRECLK is coupled to the clock input of UP counter 502, and the current counter reset signal RESET CC is coupled to a first input of OR gate 508. A power on reset signal couples to a second input of OR gate 508. The output of OR gate 508 couples either the current counter reset signal RESET CC or the power on reset signal to the UP counter 502 RESET input. The output of UP counter 502 is coupled to the input of count detector 504, which generates a predetermined number of count detection outputs when the UP counter 502 count equals preselected count values, such as zero (0), one (1) or other preselected values, such as two (2), three (3), etc. The count detection outputs are coupled to the input of OR gate 506 which provides a DETECT output for each count value output selected.

In operation, the UP counter 502 is enabled when the current counter reset signal RESETCC is set to a logic zero, and reset when either the current counter reset signal RESET CC is set to a logic one or the power on reset signal is generated. The current counter 502 then counts up in response to the prescaled frequency signal PRECLK. When the UP counter 502 count exceeds one of the preselected count detection values, the DETECT output is set to a logic zero value, indicating the reference frequency signal FR and the feedback frequency signal FV are substantially different, such as occurring during frequency switching. When the UP counter 502 count matches one of the preselected count values, the DETECT output of the current counter 62 is set to a logic one value, indicating the phase locked loop output frequency is close to the actual frequency selected, i.e. the difference between the reference frequency signal FR and the feedback frequency signal FV are within a predetermined number of prescaled frequency signal time intervals.

Figure 6:
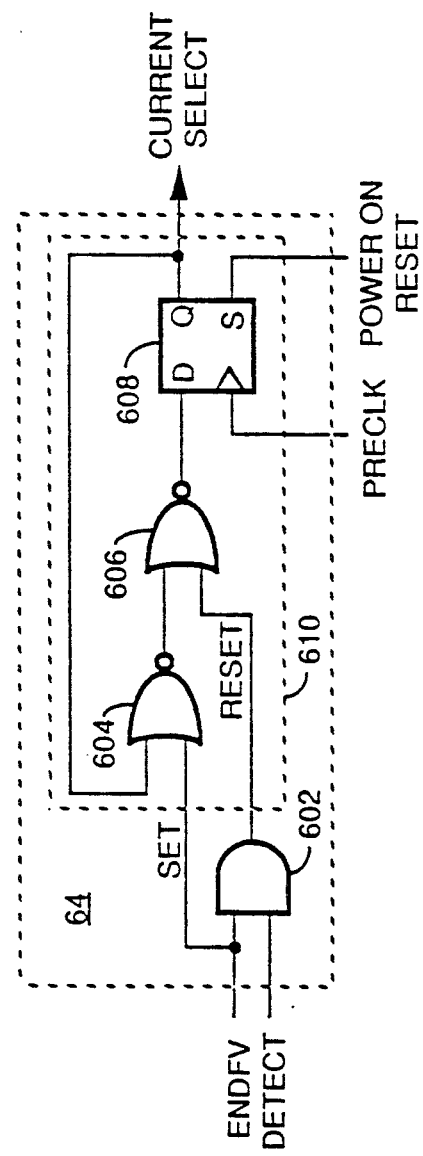
FIG. 6 is a logic circuit schematic of an embodiment suitable for use as a current control circuit of the frequency synthesizer depicted in FIG. 2.

FIG. 6 is a logic circuit schematic of an embodiment suitable for use as a current control circuit 64 with the adaptive lock time controller 52 of the frequency synthesizer depicted in FIG. 2. As shown in FIG. 6, the current control circuit 64 comprises an AND gate 602 having two inputs, one coupled to the feedback frequency end signal ENDFV, and one coupled to the DETECT signal. The feedback frequency end signal ENDFV also couples to an input of NOR gate 604. The output of AND gate 602 couples to the input of NOR gate 606. The second input of NOR gate 606 is coupled to the output of NOR gate 604. The output of Nor gate 606 couples to the data input of D flip-flop 608. The output of D flip-flop 608 couples to the second input of NOR gate 604 and also provides a CURRENT SELECT output. The clock input of D flip-flop 608 is coupled to the prescaled frequency signal PRECLK, and the set input of D flip-flop 608 is coupled to the power on reset signal.

In operation, NOR gates 604 and 606 in combination with D flip-flop 608 forms a clocked R-S (set-reset) flip-flop 610. The clocked R-S flip-flop 610 is normally set by the power on reset signal to the wide bandwidth condition indicating that the phase locked loop is in an unlocked condition, as would be expected at power on. At the end of each NPU or NPD command signal interval, indicated when the feedback frequency end signal ENDFV is generated, the current control circuit 64 is used to evaluate whether the low adaptive lock time current value is to be selected, or the high adaptive lock time current value is to be maintained for the next reference clock period. When the DETECT signal input is a logic one, indicating that the reference frequency signal FREF and the feedback frequency FV signal are close in frequency, such as when the loop is phase locked, a logic one pulse is generated at the output of AND gate 602 when the feedback frequency end signal ENDFV is generated, resetting the R-S flip-flop 610, and enabling the narrow bandwidth condition to be selected during the next reference clock period. When the DETECT signal input is a logic zero, indicating that the reference frequency signal FREF and the feedback frequency signal FV are relatively far apart in frequency, such as after a new frequency of operation is selected, the RESET pulse described above is inhibited, and the R-S flip-flop 610 is set when the feedback frequency end signal ENDFV is generated, enabling the wide bandwidth condition to be selected during the next reference clock period.

In summary, the current control circuit 64 is used to select when the wide and narrow bandwidths are to be selected, thereby controlling the rate at which lock is achieved by the phase locked loop.

Figure 7:
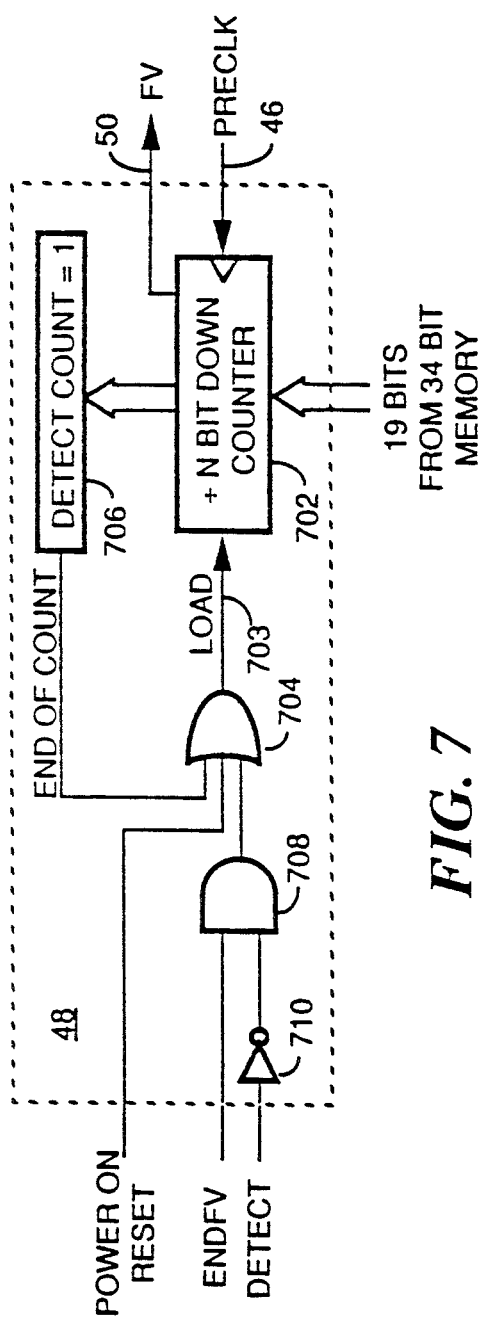
FIG. 7 is a logic circuit schematic of an embodiment suitable for use as a divide-by-N counter of the frequency synthesizer depicted in FIG. 2.

FIG. 7 is a logic circuit schematic of an embodiment suitable for use as a divide-by-N counter of the frequency synthesizer depicted in FIG. 2. As shown in FIG. 7, the divide-by-N counter includes an N bit down counter 702 which includes a clock input derived from the prescaled frequency signal PRECLK present on signal line 46, and a load input coupled to LOAD signal line 703. The load input is coupled through LOAD signal line 703 to the output of OR gate 704. One input of OR gate 704 is coupled to an END OF COUNT output of count detector circuit 706. The input of the count detector circuit 706 is coupled to the parallel outputs of N bit down counter 702, and generates the END OF COUNT output when the count detected at the output of the N bit down counter 702 is equal to one (1). It will be appreciated that other end of count conditions, such as zero, may be utilized as well. A second input of OR gate 704 is coupled to the output of AND gate 708. One input of AND gate 708 is coupled to the feedback frequency end signal ENDFV generated by the adaptive lock time controller circuit 52. The second input of AND gate 708 couples to the output of an INVERTER 710. The input of INVERTER 710 is coupled to the DETECT signal generated by the adaptive lock time controller circuit 52. A third input of OR gate 704 is coupled to the power on reset signal.

In operation, when the DETECT signal is set to a logic one value, indicating the reference frequency signal FR and the feedback frequency signal FV are close, the output of INVERTER 710 is a logic zero which is coupled to the input of AND gate 708, thereby generating a logic zero at the output of AND gate 708. When a logic zero is generated at the output of AND gate 708, the LOAD signal is determined solely by the generation of the END OF COUNT signal generated by the count detector 706 which is coupled to the second input of OR gate 704. Consequently, when the phase lock loop is locked, or very close to being locked as determined by the current counter circuit 62, the N bit down counter 702 is asynchronously loaded as compared to the divide-by-K counter 22.

However, when the DETECT signal is set to a logic zero value, indicating the reference frequency signal FR and the feedback frequency signal FV are substantially far apart, such as following a frequency change, the output of INVERTER 710 is a logic one which is coupled to the input of AND gate 708. Since the feedback frequency end signal ENDFV is normally a logic zero value which is applied to the second input of AND gate 708, a logic zero value is generated at the output of AND gate 708. When the feedback frequency end signal ENDFV becomes a logic one value, as described above, a logic one value is generated at the output of AND gate 708, and the LOAD signal is generated which is coupled through the LOAD signal line 703 to the N bit down counter 702. As a result, the adaptive lock time controller 52 controls the loading of the N bit down counter 702. Because the reference frequency signal FREF and the feedback frequency signal FV are substantially different following a frequency change, the N bit down counter LOAD signal is generated by the adaptive lock time controller 52, resulting in the synchronous loading of the N bit down counter and the divide-by-K prescaler. Such synchronous loading will continue to occur until the reference frequency signal FR and the feedback frequency signal FV are sufficiently close to each other.

The power on reset signal, which couples to the third input of OR gate 704, is utilized to preset the N bit down counter at the start of operation, such as when power is first applied to the phase lock loop.

Figure 8:
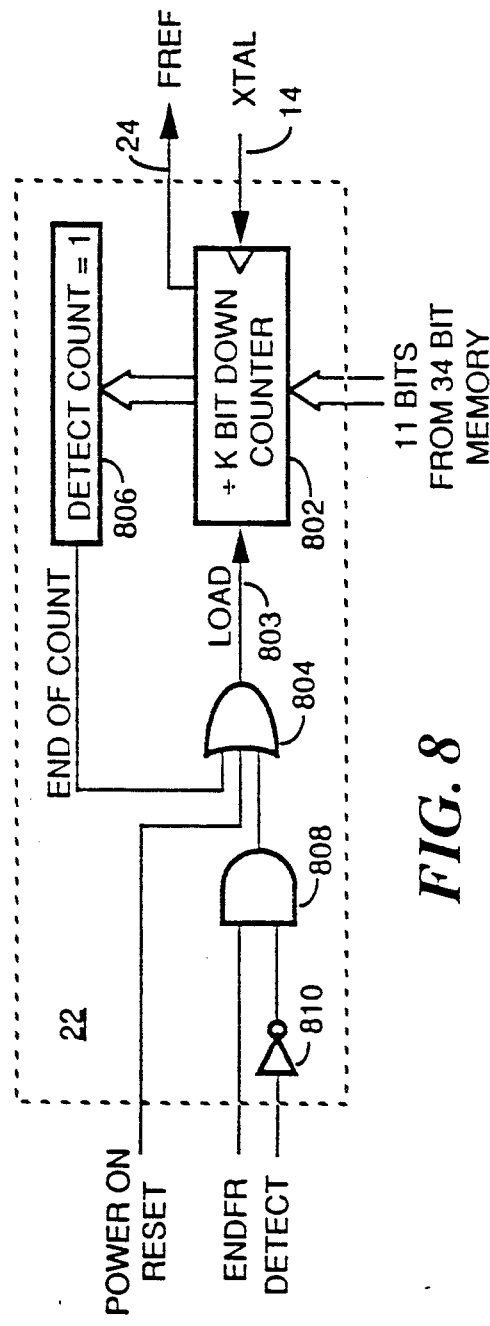
FIG. 8 is a logic circuit schematic of an embodiment suitable for use as a divide-by-K counter of the frequency synthesizer depicted in FIG. 2.

FIG. 8 is a logic circuit schematic of an embodiment suitable for use as a divide-by-K counter of the frequency synthesizer depicted in FIG. 2. As shown in FIG. 8, the divide-by-K counter includes a K bit down counter 802 which includes a clock input derived from the reference clock signal XTAL, and a load input coupled to LOAD signal line 803. The load input is coupled through the LOAD signal line 803 to the output of OR gate 804. One input of OR gate 804 is coupled to an END OF COUNT output of count detector circuit 806. The input of the count detector circuit 806 is coupled to the parallel outputs of K bit down counter 802, and generates the END OF COUNT output when the count detected at the output of the K bit down counter 802 is equal to one (1). The second input of OR gate 804 is coupled to the output of AND gate 808. One input of AND gate 808 is coupled to the feedback frequency end signal ENDFV generated by the adaptive lock time controller circuit 52. The second input of AND gate 808 couples to the output of an INVERTER 810. The input of INVERTER 810 is coupled to the DETECT signal generated by the adaptive lock time controller circuit 52. A third input of OR gate 804 is coupled to the power on reset signal.

The operation of the divide-by-K counter 22 is the same as described for the divide-by-N counter 46, providing a synchronous loading operation together with the loading of the divide-by-N counter when the reference frequency signal FR and the feedback frequency signal FV are relatively far apart, and an asynchronous loading operation when the reference frequency signal FR and the feedback frequency signal FV are relatively close together, as determined by the current counter circuit 62, described above.

The power on reset signal, which couples to the third input of OR gate 804, is utilized to preset the K bit down counter at the start of operation, such as when power is first applied to the phase lock loop.

Figure 9:
FIGS. 9A-9M depict timing waveforms A-M which illustrate the operation of the divide-by-N counter depicted in FIG. 7.

FIG. 9 depicts timing waveforms A-M which illustrate the operation of the divide-by-N counter depicted in FIG. 7. It is assumed that the count generated by the divide-by-N counter is 900, as described above, in TABLE I, for the examples to follow. In particular, FIG. 9A shows the prescaled frequency signal PRECLK which is utilized to clock the divide-by-N counter. FIGS. 9B through 9E illustrate the operation of the divide-by-N counter when the low bandwidth, or slow adaptive locking time, operation is enabled. When the low bandwidth operation is enabled, indicating that the reference frequency FREF and feedback frequency FV are sufficiently close together, or that the loop is phase locked, the DETECT signal generated by the current counter circuit remains at a logic one value as shown in FIG. 9E. Consequently, any feedback frequency end signal ENDFV which may be generated by the reset and synchronization control circuit, is ignored. As FIG. 9D illustrates, no feedback frequency end signal ENDFV was generated during the period of interest, and the feedback frequency end signal ENDFV remained at a logic zero value. The divide-by-N counter values are illustrated in FIG. 9B, and indicates the counter is counting down from 3. When the counter value reaches 1, an END OF COUNT signal is generated, as illustrated in FIG. 9C, which results in an automatic loading of the divide-by-N counter with the initial value of 900. The load operation illustrated is asynchronous with respect to the loading of the divide-by-K prescaler, as described above. FIGS. 9F through 9I illustrate the operation of the divide-by-N counter when the feedback frequency signal is faster than the reference clock signal FREF. As shown in FIG. 9F, the divide-by-counter is counting down. Since the feedback frequency FV is faster than the reference frequency FREF, the divide-by-N counter counts down to zero faster than the divide-by-K prescaler. In the example shown, the divide-by-N counter is counting from a value of 3, and when the divide-by-N counter value reaches 1, as shown in FIG. 9G, an END OF COUNT signal is generated which automatically reloads the counter with a value of 900, the loading being accomplished asynchronously with respect to the divide-by-K prescaler, as described above. When the current counter reset signal RESET CC is generated as described above for FIG. 3, the Up counter shown in FIG. 5 is released to begin counting. When the Up counter output exceeds a value of 1, which is shown in FIG. 9I, the DETECT signal is generated which is coupled to the divide-by-N circuit. Upon the generation of the feedback frequency end signal ENDFV as shown in FIG. 9H, the divide-by-N counter is again loaded with a value of 900, as shown in FIG. 9F, the loading being now accomplished substantially synchronously with respect to the divide-by-K prescaler, as described above.

FIGS. 9J through 9M illustrate the operation of the divide-by-N counter when the feedback frequency signal FV is slower than the reference clock signal FREF. As shown in FIG. 9F, the divide-by-counter is counting down. As described above, the divide-by-N counter is counting from a value of 3, and when the divide-by-N counter value reaches 1, as shown in FIG. 9J, an END OF COUNT signal is generated which automatically reloads the counter with a value of 900, the loading being accomplished asynchronously with respect to the divide-by-K prescaler, as described above. Since the feedback frequency signal FV is slower than the reference clock signal FREF, the current counter reset signal RESET CC is generated earlier, and the Up counter is released to begin counting, as indicated in FIG. 9M. When the Up counter output exceeds a value of 1, which as shown in FIG. 9M, the DETECT signal is generated which is coupled to the divide-by-N circuit. Upon the generation of the feedback frequency end signal ENDFV as shown in FIG. 9L, the divide-by-N counter is again loaded with a value of 900, as shown in FIG. 9J, the loading being now accomplished substantially synchronously with respect to the divide-by-K prescaler, as described above.

In summary, FIGS. 9A through 9M illustrate the loading and counting of the divide-by-N counter. When the feedback frequency signal FV and the reference frequency signal FREF are close, no detect signal is generated, and the loading of the divide-by-N counter is accomplished asynchronously with respect to the divide-by-K prescaler. When the feedback frequency signal FV and the reference frequency signal FREF are far apart, a detect signal is generated, and the loading of the divide-by-N counter is accomplished synchronously with respect to the divide-by-K prescaler. The loading operations for the divide-by-K prescaler shown in FIG. 8 are similar to the loading operations described for the divide-by-N counter shown in FIG. 9.

Figure 10:
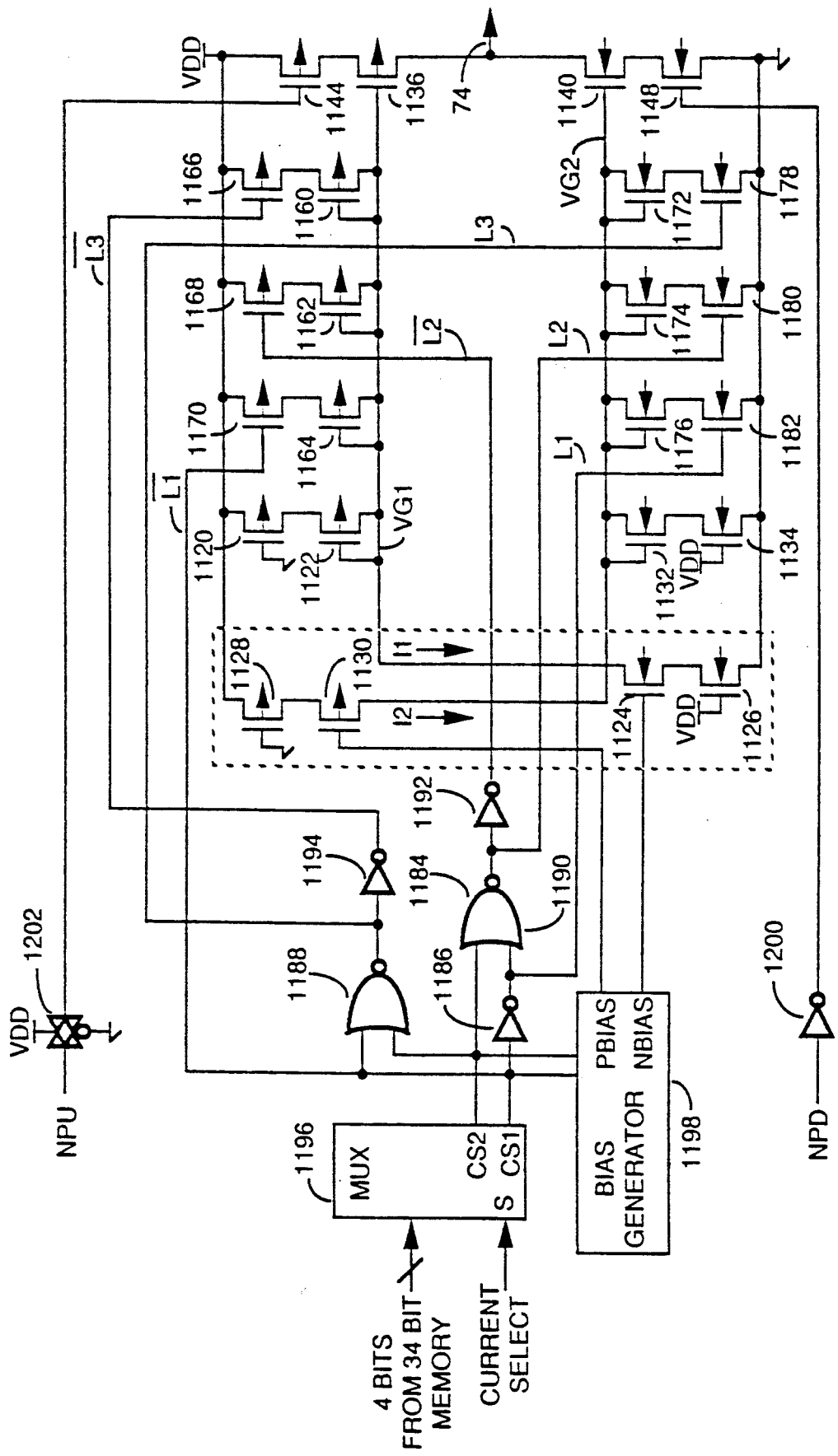
FIG. 10 is a electrical schematic diagram of an embodiment suitable for use as a charging circuit of the frequency synthesizer depicted in FIG. 2.

FIG. 10 is an electrical schematic diagram of an embodiment suitable for use as a charging circuit of the frequency synthesizer depicted in FIG. 2. As shown, FIG. 10 depicts a suitable embodiment of an analog charging section, in which MOSFET transistors are constructed in a circuit arrangement to form current mirrors which set the low and high current levels for the low loop bandwidth during the slow adaptive lock time period and high loop bandwidth during the fast adaptive lock time period. The combination of MOS- FET transistors 1120, 1122, 1124, and 1126 are coupled in tandem between the battery supply VDD and ground to effect a bias current Il for the current mirrors of the current sourcing stages. The value of the sourcing bias current Il is set by a bias voltage NBIAS which is programmably generated by a common bias circuit 1198 and applied to the gate of the transistor 1124. A circuit suitable for implementing the common bias circuit 1198 is described in U.S. Pat. No. 4,901,033 to Herold et al., which is assigned to the assignee of the present invention, and which is hereby incorporated by reference herein.

Similarly, a tandem arrangement of MOSFET transistors 1128, 1130, 1132, and 1134 are coupled between the supply voltage VDD and ground to effect a bias current I2 for the current sinking mirror circuits. Moreover, the value of the bias current I2 which is set by a bias voltage PBIAS is also programmably generated by the common bias circuit 1198 and applied to the gate of the transistor 1130.

Still further, a voltage Vg1 is produced at the drain of the diode configured MOSFET transistor 1122 and is coupled to the gate of MOSFET transistor 1136 to produce a current mirroring effect thereat. That is, the sourcing current level conducted through transistor 1136 is an amplification of the bias current Il based on the width to length ratios (gain relationship) of the transistors 1122 and 1136 in a manner well known in the art. In the present embodiment, this ratio is set at a predetermined value which is suitable for the low loop bandwidth state.

In the same manner, a voltage Vg2 is effected at the source of the diode configured MOSFET transistor 1132 in accordance with the value of the bias current I2. The voltage signal Vg2 is coupled to the gate of MOSFET transistor 1140 to produce the current mirroring effects (gain relationship) for the sinking current levels in the low loop bandwidth state as that described above for the transistor 1136. For the present embodiment, the amplification settings for the transistors 1140 is substantially the same as those set for transistor 1136.

MOSFET transistor 1144 is coupled between the transistor 1136 and the voltage supply VDD. The transistor 144 is controlled by the NPU command signal which is coupled through TRANSMISSION GATE 1202 to the gate of transistor 1144, causing transistor 1144 to conduct and not conduct low level sourcing current through the transistor 136. Hereinafter, the coupled transistor pair 1136 and 144 will be referred to as SW1. In a similar manner, the MOSFET transistor 1148 is coupled between transistor 1140 and ground potential. The transistor 1148 is controlled by the NPD command signal which is coupled through INVERTER 1200 to the gate of transistor 1148, causing transistor 1148 to conduct and not conduct low level sinking current through transistor 1140. Hereinafter, the coupled pair 1140, 1148 will be referred to as SW2.

In operation, source current is supplied to or drained from the capacitive element 52 via signal line 74 through SW1 and SW2 as controlled by the command signals NPU and NPD, respectively. For the present embodiment, the design
is such that when command signal NPU is a logical 0 and command signal NPD is a logical 1, switches SW1 and SW2 are off, creating a floating state at the conduction line 74. This floating state may be created, such as during a battery saving sleep cycle, in order to maintain the voltage across the capacitive element 52.

In accordance with the present invention, a plurality of switchable diode sections are included as part of the current mirror circuits of the embodiment of the charging circuit 28 as shown in FIG. 10. The combination of the multiplexer 1196, control signals CS1 and CS2, and the additional switchable diode sections of the mirror circuits comprise a digitally programmable control circuit for dynamically setting the loop bandwidth states for the fast and slow adaptive lock timing intervals. More specifically, MOSFET transistors 1160, 1162, and 1164 are configured as diodes and disposed in tandem with their respective switchable MOSFET transistors 1166, 1168, and 1170 between the voltage supply bus VDD and the drain of MOSFET transistor 1122. In this configuration, the switchable diode sections 1160, 1166; 1162, 1168; and 1164, 1170 are all in parallel with each other and in parallel with the non-switchable diode section comprising MOSFET transistors 1120 and 1122.

Also, in a similar configuration, MOSFET transistors 1172, 1174, and 1176 are connected as diode elements in tandem with their respective MOSFET switches 1178, 1180, and 1182 between ground potential and the source of MOSFET transistor 1132. In this arrangement, the switchable diode sections 1172, 1178; 1174, 1180; and 1176, 1182 are in parallel with each other and in parallel with the non-switchable diode section comprising MOSFET transistors 1132 and 1134.

The plurality of switchable diode sections may be controlled by the programmed code of the digital signals CS1 and CS2 as decoded by a decoder circuit 1184. More specifically, the digital signal CS1 is coupled to an input of an inverter gate 1186, to one input of a NOR gate 1188 and to the gate of the MOSFET switch 1170 over signal line denoted as $\overline{L1}$. The output of the inverter gate 1186 is coupled to one input of a NOR gate 1190 and also to the gate of the MOSFET switch 1182 over a signal line denoted as L1. The digital signal CS2 is coupled to one input of both of the NOR gates 1188 and 1190. In addition, the output of the NOR gate 1190 is coupled to the gate of the MOSFET switch 1180 over a signal line denoted as L2 and also to the gate of the MOSFET switch 1168 via an inverter gate 1192 and a signal line denoted as $\overline{L2}$. Still further, the output of the NOR gate 1188 is coupled to the gate of the MOSFET switch 1178 over a signal line denoted as L3 and also to the gate of the MOSFET switch 1166 via an INVERTER 1194 and a signal line denoted as $\overline{L3}$.

In this configuration, the switchable diode sections comprising the MOSFET switches 1164, 1170 and 1176, 1182 are switched concurrently to conduct and not conduct bias current therethrough by the signal L1 and its converse $\overline{L1}$. Similarly, the switchable diode sections comprising the MOSFET transistors 1162, 1168 and 1174, 1180 are controlled concurrently to conduct and not conduct bias current by the signals $\overline{L2}$ and $\overline{L2}$ ; and likewise, the switchable diode sections of 1160, 1166 and 1172, 1178 controlled concurrently by the signals L3 and $\overline{L3}$.

In the present embodiment, the MOSFET transistors of the diode sections have a particular width to length ratio design to control the bias current for generating low and high bandwidth conditions. The principle of operation of the present embodiment is such that when a diode section is switched to conduct its respective bias current, the level of which being set by the voltage signals PBIAS and NBIAS, the width to length ratio of the conducting MOSFET transistors are additive to the width to length ratio of the MOSFET of its respective non-switching section to alter the gain relationship of its respective current mirror circuit to vary the current level of a selected loop bandwidth state for both of the current sourcing and sinking conditions.

For example, when the digital states of the signals CS1 and CS2 are both a logical 0, the sourcing switching diode sections 1160 and 1164 are switched on and the diode section 1162 off and similarly, the sinking switchable diode sections 1172 and 1176 are conducted on and the switchable diode section 1174 is switched off. The addition of their respective width to length ratios yields a ratio which is in a predetermined relationship with the output section yielding a predetermined gain relationship for the low bandwidth state. Under these same conditions, the high bandwidth state will have a gain relationship with the bias current which is a substantial multiple, such as fifty times that of the low bandwidth state. The settable frequency ranges or gain relationships (the two being synonymous in the present embodiment) corresponding to the coded digital states of the signals CS1 and CS2 are shown in the Table II found directly here below.

TABLE II

| CS1 | CS2 | $\overline{L1}$, L1 | $\overline{L2}$, L2 | $\overline{L3}$, L3 | Gain Relationship (LBW) |
|---|---|---|---|---|---|
| 0 | 0 | ON | OFF | ON | XA |
| 1 | 0 | OFF | ON | OFF | XB |
| 0 | 1 | ON | OFF | OFF | XC |
| 1 | 1 | OFF | OFF | OFF | XD |

In summary, four predetermined bandwidth states are selectable for controlling the fast and slow adaptive locking times of the phase lock loop. A first two bits of the four bits provided from the 34 bit memory are used to set the low bandwidth state, and the second two bits of the four bits provided from the 34 bit memory are used to set the high bandwidth state. The selection of the low and high bandwidth states is controlled by the adaptive lock time controller through the CURRENT SELECT signal which controls the operation of the multiplexer 1196. The central controller can alter the operation of the phase lock loop by loading different preselected values for the four bits in the 34 bit memory, with four different bandwidth states being controllable with the charging circuit, as described above. It will be appreciated, additional bandwidth states can be controlled, such as eight bandwidth states, when a three bit selection word is supplied from the control memory, which would then result in a 36 bit, rather than a 34 bit memory. It will also be appreciated that a corresponding change to the charging circuit decoder and an increased number of diode sections would be required to provide the additional selectable bandwidth states.

FIG. 11 depicts timing waveforms A–N which illustrate an operation of the bandwidth control circuit embodiment depicted in FIG. 3. In particular, waveforms 11A through 11G illustrate the loop operation during the pump down cycle, in which case the feedback frequency signal FV shown in waveform 11B is leading the reference frequency signal FREF shown in waveform 11A. As previously described, the divide-by-N counter and the divide-by-K prescaler are substantially simultaneously reloaded during the adaptive high lock time state at the beginning of each reference clock period, resulting is synchronization of the leading edges of the feedback frequency signal FV and the reference frequency signal FREF, as shown in waveforms 11A and 11B. The pump down command signal NPD is consequently generated only during the last portion of the reference clock period, as shown in waveform 11C. Following a delay D1, generated by the reset and control synchronization circuit, the current counter reset signal RESET CC is generated, as shown in waveform 11D, and is terminated following a delay D2 also generated by the reset and control synchronization circuit, as described above.

When the loop has not reached lock, a feedback frequency end signal ENDFV is generated, as shown in waveform 11E, resetting the divide-by-K prescaler, thereby shifting the start of the feedback frequency signal by a time interval S2, shown in waveform 11B. A reference frequency end signal ENDFR is also generated, as shown in waveform 11F, resetting the divide-by-N counter, thereby shifting the start of the reference frequency signal by a time interval S1, shown in waveform 11A, synchronizing the starts of the feedback and reference frequency signals. Since lock has not been reached, the current control circuit is set, changing the current select output to a high, as shown in waveform 11G, thereby setting the selection of the high bandwidth condition for the next reference clock period.

When a phase lock condition is detected during the current reference clock period, the current control circuit is reset, maintaining the current select output to a low condition as shown in waveform 11G, and inhibiting the synchronous loading of the divide-by-N counter and divide-by-K prescaler, as shown in waveforms 11A and 11B.

Waveforms 11H through 11N illustrate the loop operation during the pump up cycle, in which case the feedback frequency signal FV shown in waveform 11I is lagging the reference frequency signal FREF shown in waveform 11H. As previously described, the divide-by-N counter and the divide-by-K prescaler are simultaneously reloaded during the adaptive high lock time state at the beginning of each reference clock period, resulting is synchronization of the leading edges of the feedback frequency signal FV and the reference frequency signal FREF, as shown in waveforms 11H and 11I. The pump up command signal NPU is consequently generated only during the last portion of the reference clock period, as shown in waveform 11J. Following a delay D1, generated by the reset and control synchronization circuit, the current counter reset signal RESET CC is generated, as shown in waveform 11K, and is terminated following a delay D2 also generated by the reset and control synchronization circuit, as described above.

When the loop has not reached lock, a feedback frequency end signal ENDFV is generated, as shown in waveform 11L, resetting the divide-by-K prescaler, thereby shifting the start of the feedback frequency signal by a time interval S2, shown in waveform 11I. A reference frequency end signal ENDFR is also generated, as shown in waveform 11M, resetting the divide-by-N counter, thereby shifting the start of the reference frequency signal by a time interval S1, shown in waveform 11H, synchronizing the starts of the feedback and reference frequency signals. Since lock has not been reached, the current control circuit is set, changing the current select output to a high, as shown in waveform 11N, thereby setting the selection of the high bandwidth condition for the next reference clock period.

When a phase lock condition is detected during the current reference clock period, the current control circuit is reset, maintaining the current select output to a low condition as shown in waveform 11N, and inhibiting the synchronous loading of the divide-by-N counter and divide-by-K prescaler, as shown in waveforms 11H and III.

Figure 12:
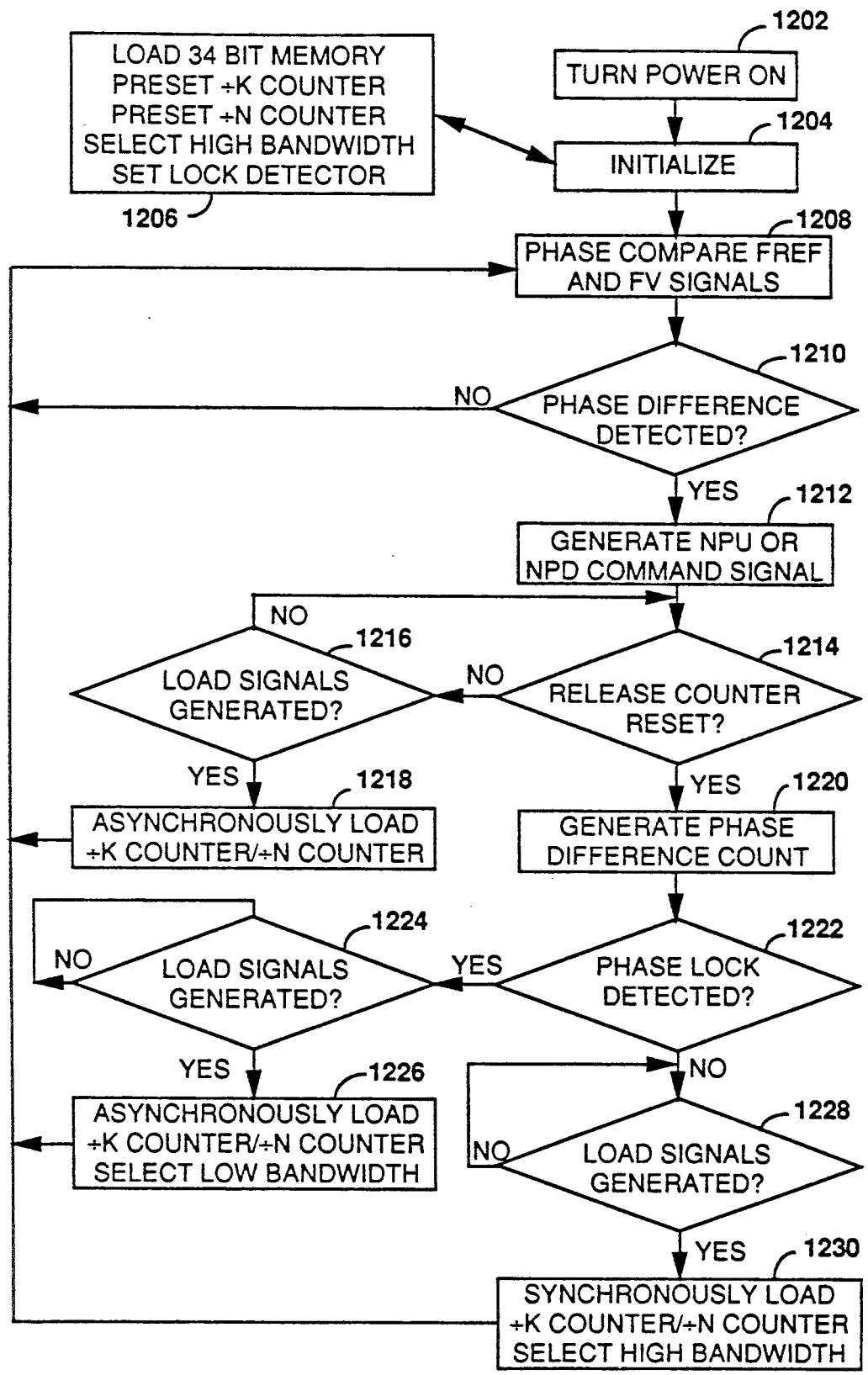
FIG. 12 is a flow chart illustrating the operation of the phase lock loop constructed in accordance with the present invention.

FIG. 12 is a flow chart illustrating the operation of a phase locked loop constructed in accordance with the present invention. When power is first turned on, at step 1202, the phase locked loop is initialized, at step 1204. During initialization, the central controller loads the 34 bit memory with the information stored for the particular frequency of operation being required, or selected, and then generates a power on reset signal which is used to preset the value of the divide-by-K prescaler, to preset the value of the divide-by-N counter, to select the high bandwidth condition, and to set the current counter circuit which functions as a lock detector circuit to a logic one output value, as shown at step 1206. It will be appreciated that other initialization functions may also be performed at this time in accordance with functions of the device in which the phase locked loop is utilized. Following initialization, the reference frequency FREF and feedback frequency FV signals are compared in the phase comparator, at step 1208. When a phase difference is not detected, at step 1210, comparison of the reference frequency FREF and feedback frequency FV signals continues at step 1208. When a phase difference is detected, at step 1210, either an NPD or an NPU command signal is generated at the high bandwidth current value. The UP counter in the current counter circuit is held reset, until released, at step 1214. When the current counter has not been released, at step 1214, and a load signal is generated, at step 1216, the divide-by-K prescaler or the divide-by-N counter is asynchronously loaded, depending upon the load signal generated. When the current counter has been released, at step 1214, a phase difference count is generated, at step 1220. When the phase difference count remains below a predetermined value during the reference clock time period, at step 1222, indicating that the loop is phase locked, and a load signal is generated, at step 1224, the divide-by-K prescaler or the divide-by-N counter is asynchronously loaded, depending upon the load signal generated. In addition, when the reference frequency end signal ENDFR is generated, at step 1224, the current control circuit is set to select a new bandwidth condition, or to maintain the low bandwidth operating condition for the next reference clock period. When the value of the phase difference count exceeds the predetermined value, at step 1222, indicating that the loop is not phase locked, and a load signal is generated at step 1228, both the divide-by-K prescaler and the divide-by-N counter are synchronously loaded, at step 1230, and the current control circuit is set to select anew, or maintain, the high bandwidth operating condition for the next reference clock period. During the next reference clock period, the phase lock loop utilizing the adaptive lock time controller in accordance with the present invention, repeats steps 1208 through 1230.

As described herein, an adaptive lock time controller for a phase lock loop has been described which synchronizes the leading edges of the reference frequency and feedback frequency signals during each reference clock period, when the high bandwidth condition is selected. By synchronizing the reference frequency and feedback frequency signals, erroneous phase detector operation is eliminated, which advantageously results in enabling an optimized control of the phase locking operation which significantly improves phase lock loop locking times.

We claim:

1. An adaptive lock time controller for a phase locked loop having a dividing means for generating first and second loop timing signals, a phase detecting means for detecting phase differences between the first and second loop timing signals, a voltage controlled oscillator for generating an output frequency, and a charging circuit for generating at least a first control signal for converging the output frequency to a predetermined frequency and a second control signal for maintaining the output frequency substantially constant, said controller further comprising:

means, responsive to the phase detecting means, for generating a synchronization signal having a period representative of the phase difference between the first and second loop timing signals for substantially synchronizing the first and second loop timing signals generated by the dividing means during a predetermined time interval;

means for detecting phase locked and unlocked conditions during the predetermined time interval, said detecting means comprising first counting means, responsive to the synchronization signal, for generating a count representative of the phase difference between said first and second loop timing signals, and count detecting means, responsive to the count generated, for generating an unlocked detection signal when the count exceeds a predetermined value; and means for selecting the first control signal during the predetermined time interval when the phase unlocked condition is detected.

2. The adaptive lock time controller according to claim 1, wherein the dividing means comprises:

second counting means for generating a predetermined count;

count detecting means, coupled to said second counting means, for detecting a predetermined end count, and for generating a load signal in response thereto; and loading means, responsive to the load signal, for loading the predetermined count into said second counting means.

3. The adaptive lock time controller according to claim 2, wherein said second counting means comprises first and second counters for generating first and second predetermined counts corresponding to the first and second loop timing signals.

4. The adaptive lock time controller according to claim 3, wherein said first and second counters are presettable down counters.

5. The adaptive lock time controller according to claim 4, further comprising memory means, coupled to said first and second counters, for storing the first and second predetermined counts.

6. The adaptive lock time controller according to claim 2, wherein said loading means is further responsive to the synchronization signal and the unlocked detection signal for loading the predetermined count into said counting means.

7. The adaptive lock time controller according to claim 1, wherein said selecting means further selects the second control signal during the predetermined time interval when a phase locked condition is detected.

8. The adaptive lock time controller according to claim 1, wherein the predetermined time interval is generated periodically, and said phase detecting means periodically detects the phase locked and unlocked conditions.

9. The adaptive lock time controller according to claim 8, wherein the predetermined time interval corresponds to the time interval generated by a reference clock.

10. A method for controlling the operation of a phase locked loop which is responsive to a first control signal for converging the output frequency to a predetermined frequency and a second control signal for maintaining the output frequency substantially constant, said method comprising the steps of:

generating a first loop timing signal representative of the output frequency and a second loop timing signal representative of a reference frequency signal;

generating a synchronization signal for substantially synchronizing the first and second loop timing signals during a predetermined time interval;

detecting phase locked and unlocked conditions during the predetermined time interval by generating a count representative of the phase difference between the first and second loop timing signals;

comparing the count generated to a predetermined count, and generating a signal representative of the phase locked condition when the predetermined count exceeds the count generated, and a signal representative of the phase unlocked condition when the count generated exceeds the predetermined count; and selecting the first control signal during the predetermined time interval when the phase unlocked condition is detected.

11. The method for controlling the operation of a phase locked loop according to claim 10 further comprising said step of selecting the second control signal during the predetermined time interval when the phase locked condition is detected.

12. The method for controlling the operation of a phase locked loop according to claim 10 further comprising said steps of:

periodically generating synchronization signals for substantially synchronizing the first and second loop timing signals during subsequent predetermined time intervals;

periodically detecting the phase locked and unlocked conditions during the subsequent predetermined time intervals selecting the first control signal during the subsequent predetermined time intervals when the phase unlocked condition is detected, and selecting the second control signal during the subsequent predetermined time intervals when the phase locked condition is detected.

13. A communication receiver, comprising:

a receiver for receiving communication signals transmitted on a predetermined frequency channel;

a frequency synthesizer including a phase locked loop for generating an output signal for enabling the reception of the predetermined frequency channel, said loop being responsive to a first control signal for converging the output frequency to the predetermined frequency channel and a second control signal for maintaining the output frequency substantially constant, said synthesizer further comprising dividing means for generating a first loop timing signal representative of the output signal and a second loop timing signal representative of a reference frequency signal, means, responsive to the phase detecting means, for generating a synchronization signal having a period representative of the phase difference between the first and second loop timing signals for substantially synchronizing the first and second loop timing signals generated by the dividing means during a predetermined time interval, means for detecting phase locked and unlocked conditions during the predetermined time interval, said detecting means comprising first counting means, responsive to the synchronization signal, for generating a count representative of the phase difference between said first and second loop timing signals, and count detecting means, responsive to the count generated, for generating an unlocked detection signal when the count exceeds a predetermined value, and means for selecting the first control signal during the predetermined time interval when the phase unlocked condition is detected.

14. The communication receiver according to claim 13 further comprising means for selecting the second control signal during the predetermined time interval when the phase locked condition is detected.

15. The communication receiver according to claim 13 further comprising:

demodulator means for demodulating the received further comprising:

audio processing means, for processing the demodulated communication signal to provide audio output signals; and means for audibly reproducing the audio output signal.

* * * * *